United States Patent [19]

Matsumoto et al.

[11] Patent Number: 4,736,185

[45] Date of Patent: Apr. 5, 1988

[54] DIGITAL DISPLAY APPARATUS

[75] Inventors: Katsutake Matsumoto; Yoichi Yachida, both of Niigata, Japan

[73] Assignee: Nippon Seiki Co., Ltd., Niigata, Japan

[21] Appl. No.: 924,629

[22] Filed: Oct. 29, 1986

[30] Foreign Application Priority Data

Oct. 29, 1985 [JP] Japan .................................. 60-243385

[51] Int. Cl.$^4$ .......................... B60Q 1/00; G08B 25/00
[52] U.S. Cl. .................................. 340/52 R; 340/52 F; 340/525
[58] Field of Search .................... 340/52 R, 52 F, 525, 340/657, 683, 691

[56] References Cited

U.S. PATENT DOCUMENTS 4,521,885  6/1985  Melocik et al. .................. 340/52 F Primary Examiner—Donnie L. Crosland
Attorney, Agent, or Firm—Lowe, Price, LeBlanc, Becker & Shur

[57] ABSTRACT

A digital display apparatus monitors changes in a measurement value, e.g., voltage or fuel load, and in response, controls the rate at which the display is updated, to prevent flicker. When changes in the measurement value are small in amplitude or resemble noise pulses, the response time of the display is slowed. However, when the changes in the measurement values are large in amplitude or appear to be noise-free, response time is quickened so that a correct value is rapidly displayed.

5 Claims, 2 Drawing Sheets

DIGITAL DISPLAY APPARATUS

BACKGROUND OF THE INVENTION

1. Field of the Invention

The present invention relates to an apparatus digitally detecting and displaying changes in a measurement value or more particularly a digital display apparatus of, for example, a fuel gage or voltmeter in which flickers of the displayed value are prevented.

2. Description of the Prior Art

As a display apparatus in which the flickers of the displayed value due to irregular changes (hereinafter to be called noise), other than normal changes in the measurement value, such as, for example, caused by external oscillation or variation in a load are prevented, there has been known such as disclosed in U.S. Pat. No. 4,509,044.

The one mentioned above is adapted therein such that a piece of sampling data output as a digital signal corresponding to a measurement value detected by a sensor at intervals of a predetermined period is compared with a piece of display data corresponding to a display value currently displayed on a display unit and the difference therebetween or a value corresponding to the difference is accumulated, the accumulated value is detected as to whether or not it has exceeded a predetermined range, and the display data is updated when the same has exceeded the predetermined range, and thus, irregular changes in the measurement value due to noise are absorbed and flickers of the displayed value are prevented.

However, the above mentioned prior art is of such a system that the difference between the sampling data and the display data or the values corresponding to the difference are accumulated as they are, and so, if the apparatus is provided with a slower response in order to prevent flickers due to irregular changes, or noise, other than normal changes, in the measurement value, i.e., such changes produced by small-amplitude fluctuations or narrow-width pulses as shown in FIG. 4A, there arises a problem that the response will become slower also to the real changes in the measurement value as shown in FIG. 4B. Therefore, the prior art system can be applied to a display apparatus for slowly changing measurement values, but the same, with its too slow a response, cannot be applied to a display apparatus for an abruptly changing measurement value.

SUMMARY OF THE INVENTION

The present invention was made with the foregoing problem in view, and a primary object of the present invention is the provision of a digital display apparatus adapted such that, when the changes in the measurement value are of small-amplitude or pulsing narrow-width noise, its response will be made slower so that the flickers in the display value are prevented, and, when the changes in the measurement value are not of the noise but real changes, the response will be quickened so that a correct value is rapidly displayed, and therefore is applicable also to a display apparatus for a sharply changing measurement value.

DESCRIPTION OF THE PREFERRED EMBODIMENTS

Figure 1:
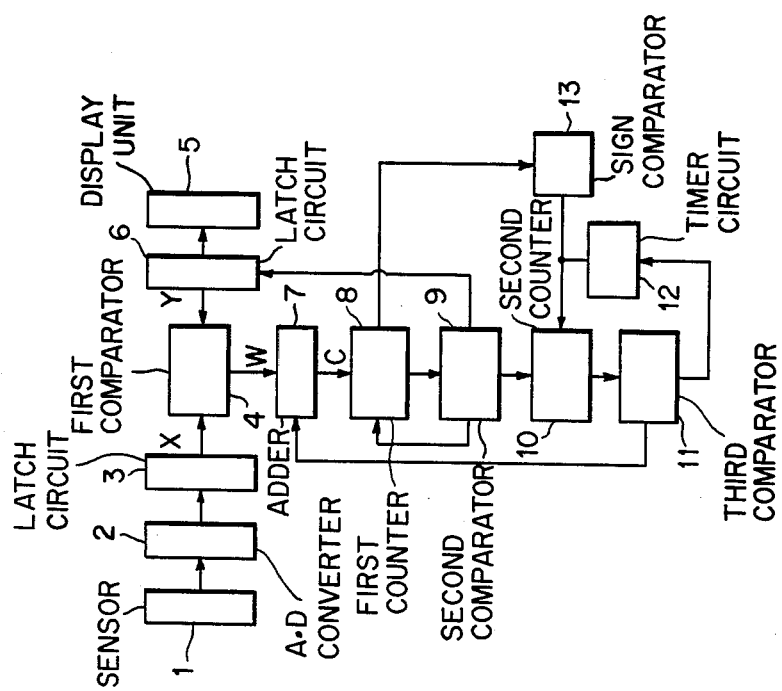
FIG. 1 is a block diagram showing an embodiment of the present invention.
Figure 4A:
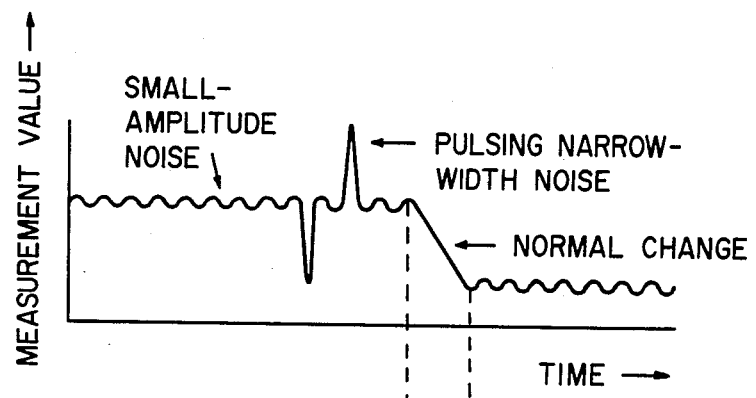
FIG. 4 includes a graph (A) showing changes in a measurement value; and a graph (B) showing changes in a display value.
Figure 4B:
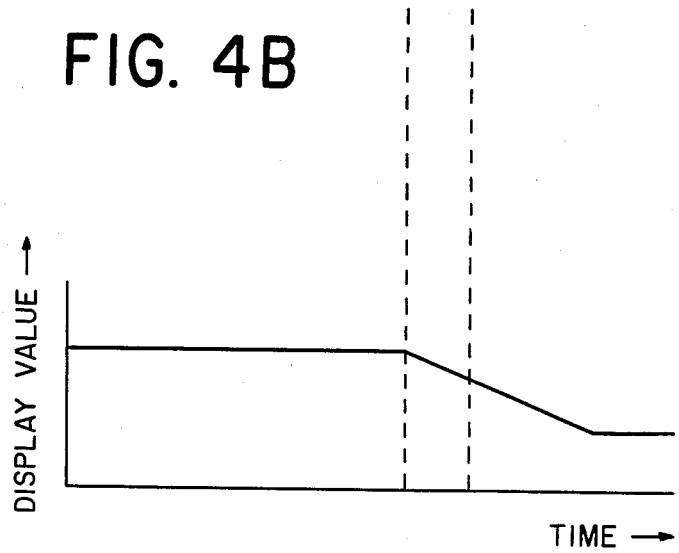

FIG. 1 shows an embodiment of the apparatus of the present invention applied to a voltmeter, wherein an analog signal as a measurement value detected by a voltage sensor 1 is converted by an A/D converter 2 into a digital signal at a predetermined sampling period. A latch circuit 3 retains the digital signal which is updated at the predetermined period and outputs the same as a piece of sampling data X to a first digital comparator 4. The first digital comparator 4 is connected with a digital display unit 5 arranged to include a decoder driver and serves to compare the data currently retained by a latch circuit 6, which is for retaining the display data Y corresponding to the value displayed on the display unit 5, with the above mentioned updated sampling data X from the latch circuit 3. According to the difference W between the sampling data X and the display data Y and a piece of data to be output from a later discussed third comparator, an addend C is provided by an adder 7, and this addend C is accumulated in a first counter 8.

A second comparator 9 compares a reference value A, which is predetermined and used for determining a display updating period to indicate the timing for updating the display, with the above mentioned accumulated addends in the first counter 8. A second counter 10 is for counting the number of times of the display updates made, for which display updating instructions have been output to the latch circuit 6 from the second comparator 9 when the value of the accumulated addends therein have exceeded the reference value A.

A third comparator 11 is for comparing a preset reference value K for the number of times of display updates with the number of times of the display updates made counted by the second counter 10. According to the result of this comparison and to the result of the comparison made in the first comparator 4, the value of the above mentioned addend C is determined.

A timer circuit 12, depending on the result of comparison made by the third comparator 11, determines the set time T for measurement to detect whether or not the sampling data X is in the stabilized state, i.e., the state in which the difference W is smaller than a predetermined value, as well as clears the count of the display updates made in the second counter 10, so that a stabilized state of display updating is provided as soon as possible. A sign comparator 13 makes a successive comparison of the accumulated addends in the first counter 8 to detect a change of the sign of the addend input from the adder 7, i.e., a change of the sign of the difference between the sampling data X and the display data Y, and clears the second counter 10 when the change of the sign is detected.

Operations of the present invention structured as above will be described below with concrete values used by way of example. First, the difference between the sampling data X, updated at intervals of a predetermined sampling period of 1/128 second and retained by the latch circuit 3 and the display data Y, maintained in the latch circuit 6 and corresponding to the value currently displayed on the display unit 5, W ($=X-Y$), inclusive of its plus or minus sign, is detected by the first comparator 4. The dotted line in FIG. 2 indicates the sampling data X, and the solid line indicates the display data Y, and it is assumed that these data X and Y were virtually equal and in a stabilized state at the start. Then, suppose that the sampling data X is increased from 100 to 110 and a difference $W=10$ is produced between the same and the display data Y. The adder 7 decides the value of the addend C depending on whether or not the difference W is less than a predetermined value S ($=4$) and whether or not the number of times of the display updates made is detected to be less than the reference value K ($=1$) of the number of times of display updates in the third comparator 11. More specifically, the same judges the sampling data X to be in a changed state since the difference W is more than the predetermined value S, and, further, judges the state to be the first changed state a since it is detected in the third comparator 11 that the display updates made is 0—because any display update was not made within a set time T set by the timer circuit 12 on the ground that the difference W before the sampling had been smaller than the predetermined value S and the sampling data X then had been in a stabilized state—and less than the reference value K of the number of times of display updates, and thus the same sets up $C_1(=2)$ as the value for the addend C. This value $C_1$ is supplied to the first counter 8.

The second comparator 9 compares the reference value A ($=52$) with the value of the accumulated addends in the first counter 8 in order to determine the timing for the display updating. This comparison is made at intervals of the sampling period and the display updating is not made until the value of the accumulated addends exceeds the reference value A. Since $C_1$ is accumulated every sampling period, 1/128 second, the value of the accumulated addends amounts to the reference value A after 26/128 second, when the latch circuit 6 is allowed to retain 101, the earlier display data Y plus the unit value B ($=1$) for display updating, and the display on the display unit 5 is updated by the new display data Y. At the same time, the second counter 10 counts the number of times of the display updates made every time the updating is made. The third comparator 11, when the number of times of the display updates made reaches the reference value K ($=1$) of the number of times of display updates, issues an instruction to the adder 7 to change the value of the variable C.

The adder 7 sets the variable C to $C_2(=18)$ on the ground that the difference W has exceeded the predetermined value S in absolute value and the number of times of the display updates made has exceeded the reference value K and hence the sampling data is now in the second changed state b. Thereafter, when the difference W is larger than the predetermined value S every sampling period, the first counter 8 accumulates the value $C_2$, and therefore, the value of the accumulated addends exceeds the reference value A after 3/128 second, when 1 is again added to the display data Y and the display is updated. Then, the display updating is made by an increment of 1 in like manner every 3/128 second until the difference W becomes smaller than the predetermined value, and thus, the display data rapidly approaches the actual sampling data.

When, after the above described operations have been repeated, the different W becomes a value smaller than the predetermined value S ($=4$), i.e., 3, the adder 7 judges the sampling data to have reached a stabilized state and sets the variable C to $C_0(=1)$. And, if the difference W is smaller than the predetermined value S, the first counter 8 accumulates the value $C_0$. Therefore, after that time, the display on the display unit 5 is updated with an increment of 1 every 52/128 second. In the described manner, when the sampling data has approached the display data to a certain degree, the display updating period is made longer than before so that a stable state is brought about as soon as possible.

The timer circuit 12 is for setting the set time T to find if the sampling data X is in a stabilized state in the first and second changed states a and b, that is, the timer circuit 12 sets the set time T to $T_0(=36/128)$ in the first changed state a since the sampling data was brought from a stabilized state to a changed state, and unless the number of times of the display updates made is increased in the second counter 10 within the set time, it judges the sampling data X to be in a stabilized state and clears the second counter 10. And, in the second changed state b, the same sets the set time T to $T_1(=5/128)$. These set times $T_0$ and $T_1$ are determined by the third comparator 11.

The sign comparator 13 successively compares the accumulated addends in the first counter 8 and detects if the plus or minus sign of the addend C from the adder 7 differs from the previous one, and if a change of the sign is detected, the same judges that a different state from the earlier changed state has been produced and clears the second counter 10. Such a change of the sign is regarded as an indication of a stabilized state. That is, on the ground that it is uncertain whether the one time of change of the sign of the addend C output from the adder 7 is just that of a transient nature due to noise or that of the real change in the opposite direction to the earlier change of the sampling data X, and therefore, the real state cannot be found until the succeeding behaviors of the sampling data X are observed, the change of the sign is regarded as an indication of a stabilized state. Incidentally, the first comparator 4 detects the difference W inclusive of a plus or minus sign and the adder 7 outputs the addend inclusive of the plus or minus sign to the first counter 8.

Figure 2:
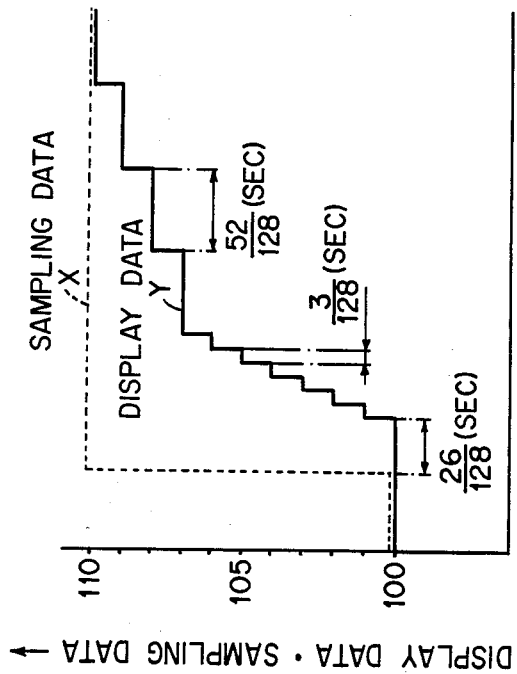
FIG. 2 is a graph showing changes in sampling data and display data in the present invention.
Figure 3:
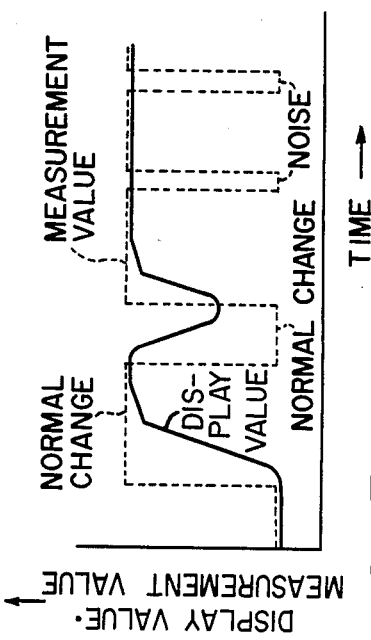
FIG. 3 is a graph showing changes in a measurement value and display value in the present invention.

As described above, when the sampling data abruptly changes from a stabilized state in which the display data Y has been unchanging for some time, the period for updating the display is changed depending on the difference between the sampling data X and the display data Y and the number of times the display updates made, and thereby, as shown in FIG. 2, the display updating period is made relatively long in the earlier stage when the sampling data X has just started to abruptly change, then the display updating period is made shorter so that the display data is rapidly brought closer to the sampling data X, and then, as the display data Y is brought close to the sampling data X, the display updating period is again prolonged. Thus, as shown in FIG. 3, the displayed value, in the normal changed state, is made to change following the change in the measured value with the display updating period shortened and the response quickened, and in case of the noise having a large amplitude but a narrow width, the accumulation therefor is not made continuously, and hence, the display is not updated, i.e., the displayed value does not change following the change in the measured value, and therefore, the occurrence of flickers can be prevented.

While an embodiment of the present invention has been described in the foregoing, appropriate variations can be made therein without departing the spirit of the present invention. For example, the above mentioned value of the addend C, reference vale A for display updating period, reference value K for the number of times of display updates, the set time T set in the timer circuit, etc. can be modified in various ways and established depending on the apparatus to which the invention is applied. And, the apparatus to which the invention is applicable may be fuel gages, and so on, in addition to the above described voltmeter.

What is claimed is:

1. A digital display apparatus comprising a first comparator for detecting the difference between a piece of sampling data corresponding to a changing measurement value detected by a sensor and output as a digital signal at an interval of a predetermined period and a piece of display data corresponding to a currently displayed value on a display unit, an adder connected to said first comparator for setting addends changeable depending on both said difference and the number of times of display updates made on the display unit within a predetermined period of time, a first counter connected to said adder for accumulating said addends at intervals of said predetermined period, a second comparator connected to said first counter for comparing a predetermined reference value for determining a display updating period with said accumulated addends and instructing display updating when the value of said accumulated addends exceeds said reference value, a second counter connected to said second comparator for counting the number of times of the display updates made, and a third comparator connected to said second counter for comparing a predetermined reference value of the number of times of display updates with said number of times of the display updates made and outputting the result of the comparison to said adder, wherein it is adapted such that the display updating period is changed depending on both the difference between said sampling data and display data and said number of times of the display updates made.

2. A digital display apparatus according to claim 1, further comprising a timer circuit in response to a result of the comparison in said third comparator for determining a set time for measurement to detect whether or not the sampling data is in a stabilized state and clearing the number of times of the display updates made retained in said second counter after said set time has elapsed.

3. A digital display apparatus according to claim 1, further comprising a sign comparator for successively comparing accumulated addends in said first counter and, when a change of the sign of the difference between the sampling data and display data has been detected thereby, clearing said second counter 10.

4. A digital display apparatus according to claim 1, wherein said digital display apparatus displays electric voltage.

5. A digital display appartus according to claim 1, wherein said digital display apparatus displays fuel remainder in a vehicle.

* * * * *